United States Patent [19]
Lehtinen

[11] Patent Number: 5,983,081
[45] Date of Patent: Nov. 9, 1999

[54] METHOD FOR GENERATING FREQUENCIES IN A DIRECT CONVERSION TRANSCEIVER OF A DUAL BAND RADIO COMMUNICATION SYSTEM, A DIRECT CONVERSION TRANSCEIVER OF A DUAL BAND RADIO COMMUNICATION SYSTEM AND THE USE OF THIS METHOD AND APPARATUS IN A MOBILE STATION

[75] Inventor: Kari T. Lehtinen, Salo, Finland

[73] Assignee: Nokia Mobile Phones, Ltd., Salo, Finland

[21] Appl. No.: 08/823,997

[22] Filed: Mar. 25, 1997

[30]     Foreign Application Priority Data

Mar. 29, 1996   [FI]   Finland .................................... 961428

[51] Int. Cl.$^6$ ..................................................... H04B 1/40
[52] U.S. Cl. .......................... 455/76; 455/86; 455/179.1; 455/188.1; 455/260
[58] Field of Search ................................. 455/76, 84, 86, 455/552, 553, 179.1, 188.1, 260, 264, 118

[56]                References Cited

U.S. PATENT DOCUMENTS 5,091,919   2/1992   Kuisma ...................................... 375/60
5,123,031   6/1992   Kuisma ...................................... 375/60
5,519,885   5/1996   Vaisanen .................................... 455/76
5,564,076   10/1996  Auvray ...................................... 455/76
5,584,068   12/1996  Mohindra ................................. 455/324
5,790,587   8/1998   Smith et al. ............................. 455/305

FOREIGN PATENT DOCUMENTS

0631400      12/1994   European Pat. Off. .
0631400 A1   12/1994   European Pat. Off. .
81933        8/1990    Finland .
92636        8/1994    Finland .
4338721      5/1995    Germany .
4338721 A1   5/1995    Germany .
WO 92/16078  9/1992    WIPO .

*Primary Examiner*—Nguyen Vo
*Assistant Examiner*—Greta J. Fuller
*Attorney, Agent, or Firm*—Perman & Green, LLP

[57]              ABSTRACT

The invention relates to a method for generating frequencies in a direct conversion transceiver of a radio communication system operating in two different frequency bands. In this method a first frequency band comprises a first transmission frequency band and a first reception frequency band, and a second frequency band comprises a second transmission frequency band and a second reception frequency band. The frequencies are Generated by using one frequency synthesizer (12) and a reference oscillator (14), which generates an essentially constant mixing frequency (L04).

20 Claims, 7 Drawing Sheets

METHOD FOR GENERATING
FREQUENCIES IN A DIRECT CONVERSION
TRANSCEIVER OF A DUAL BAND RADIO
COMMUNICATION SYSTEM, A DIRECT
CONVERSION TRANSCEIVER OF A DUAL
BAND RADIO COMMUNICATION SYSTEM
AND THE USE OF THIS METHOD AND
APPARATUS IN A MOBILE STATION

BACKGROUND OF THE INVENTION

The present invention relates to a method for generating frequencies in a direct conversion transceiver of a radio communication system operating in two different frequency bands, wherein a first frequency band comprises a first transmission frequency band and a first receiving frequency band, and a second frequency band comprises a second transmission frequency band and a second receiving frequency band. The invention also relates to a direct conversion transceiver of a radio communication system operating in two different frequency bands. In addition, the invention relates to the use of the method and the direct conversion transceiver in a mobile station.

Figure 2:
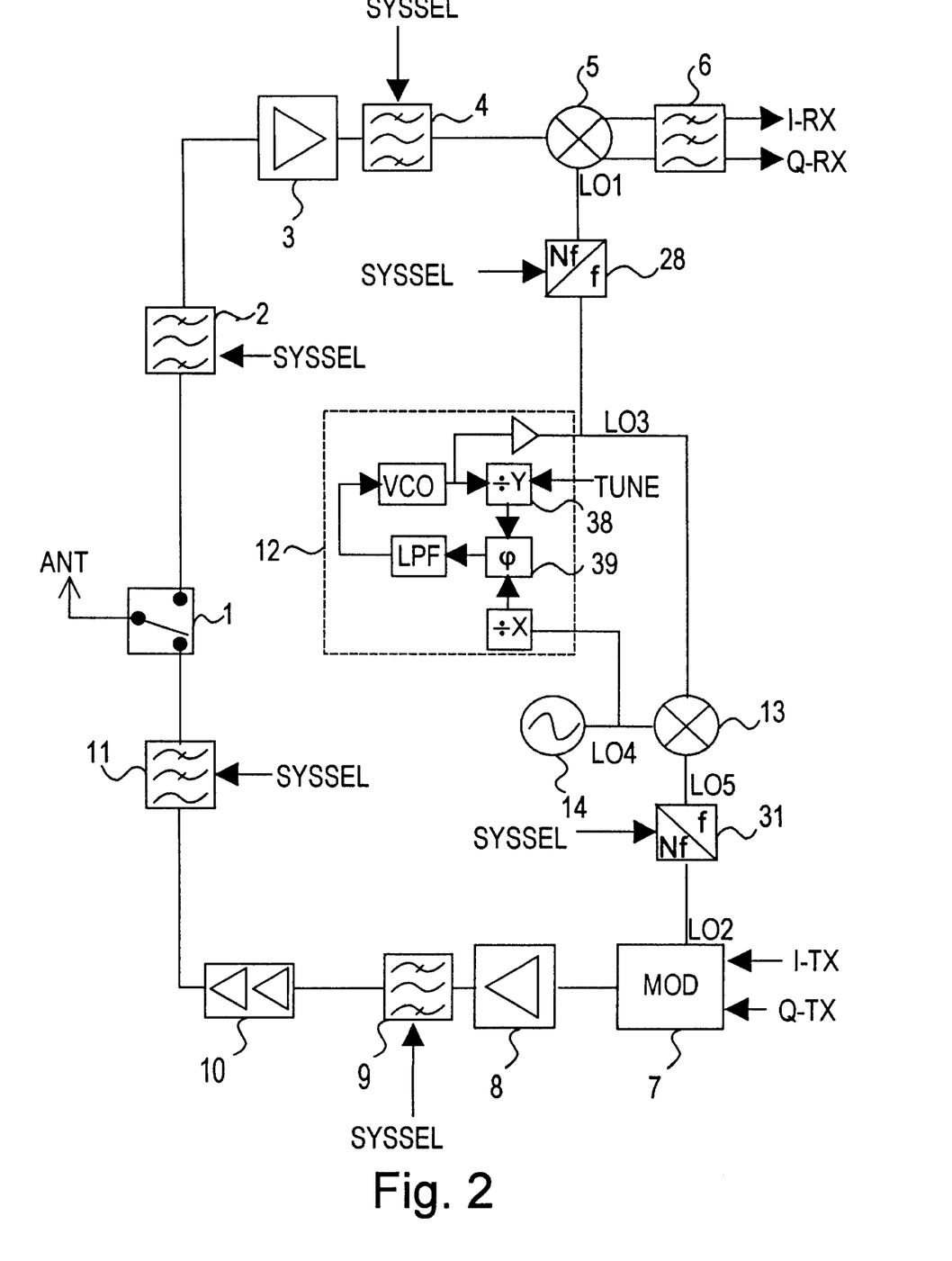
FIG. 2 shows a radio frequency part of a direct conversion transceiver according to a preferred embodiment of the invention as a simplified block diagram.

It is a known method to use a reference oscillator and one or more frequency synthesizers to generate local oscillator frequencies for the transmitter and receiver. For practical reasons, the frequency of the reference oscillator is considerably lower than the local oscillator frequencies. As is generally known and as shown in FIG. 2, the frequency synthesizer consists of a phase locked loop (PLL), by which the output frequency of the VCO is locked at the reference frequency. In this loop, the reference frequency and the frequency of the voltage controlled oscillator (VCO) are taken as divided to a phase comparator, the filtered output voltage of which is the control voltage of the voltage controlled oscillator VCO. The control voltage controls the oscillator in a manner such that its frequency is locked at the frequency coming from the reference frequency branch to the phase comparator.

In a direct conversion receiver, the local oscillator frequency is generated at the received channel frequency, whereby the received baseband signal is obtained directly as the difference between the received radio frequency signal and the local oscillator frequency. Similarly, in a direct conversion transmitter the local oscillator frequency is tuned at the transmission channel, whereby in addition to the local oscillator frequency, the modulating signal is also directed to the mixer. The mixing result includes a modulated signal at the transmission frequency, which is directed through the normal filter and amplifier stages to the antenna. A direct conversion transceiver is of a simple construction; particularly the number of radio frequency blocks is smaller than in the ordinary transceivers which include intermediate frequency stages.

In a direct conversion transceiver, the local oscillator frequency is at the actual transmission or reception frequency. If full duplex operation is not required in the system, it is possible to implement the transceiver using only one frequency synthesizer. However, a problem is, that the tuning range of the frequency synthesizer can become very wide, because it must cover both the transmission and reception channel frequencies. Furthermore, the frequency synthesizer must be capable of removing the duplex offset frequency when switching from reception to transmission or vice versa (Duplex Separation). Implementing a dual band direct conversion transceiver, such as a GSM/PCN mobile station, with the solutions known at present practically always requires the use of at least two frequency synthesizers. In some cases as much as four separate frequency synthesizers are needed, that is, separate frequency synthesizers for both the receiver and transmitter and for both frequency bands, because the tuning range required may become too wide when only one frequency synthesizer for each frequency band is used.

Figure 1:
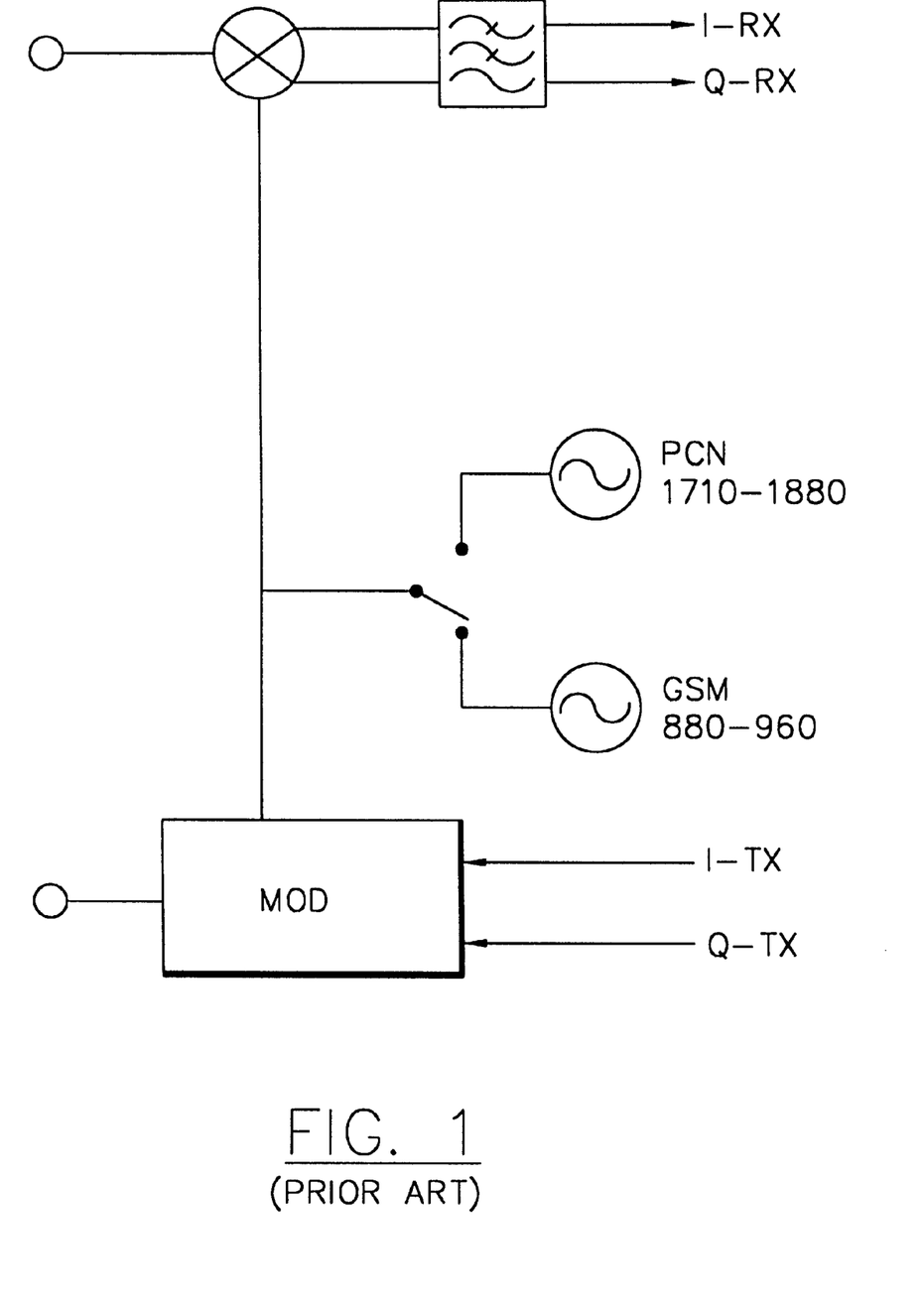
FIG. 1 shows modulator and demodulator blocks of a prior art dual band direct conversion transceiver as a simplified block diagram.

In the dual band transceiver shown in FIG. 1, separate frequency synthesizers for each frequency band are used in the radio frequency part. In a mobile station, such as GSM/PCN, this means that the frequency synthesizer used in the GSM mode of operation operates in the frequency band 880 to 960 MHz, whereas the frequency synthesizer used in the PCN mode of operation operates in the frequency band 1710 to 1880 MHz.

Since the PCN frequency band is about twice the GSM frequency band, it might be possible to implement a solution with only one frequency synthesizer if the PCN frequencies were generated by multiplying the frequency generated by the frequency synthesizer by two. In this case, the tuning range of the frequency synthesizer would be 855 to 940 MHz in the PCN mode of operation. Thus the tuning range of the frequency synthesizer should be 855 to 960 MHz, which is still relatively high, approximately 11.6%. The frequency offset that the frequency synthesizer should be capable of 45 MHz (Duplex Separation) is also relatively high.

One more possible implementation of the prior art solutions is to mix the frequency of the frequency synthesizer either on the transmission or reception side with a fixed frequency, 45 MHz in a GSM/PCN receiver, in order to remove the frequency offset between transmission and reception. Thus the tuning range of the frequency synthesizer can be decreased. However, in order to generate a fixed frequency, the oscillator must have a very stable frequency and it must be capable of being locked at an exact reference. This oscillator can be implemented by means of frequency synthesis, for example. The practical implementations thus resort to the use of two frequency synthesizers.

In practice, due to the requirements concerning speed, noise etc., the maximum tuning range with the frequency synthesizer is approx. 10% of the nominal frequency. The speed and noise requirements are opposed, that is, the faster change of frequency is desired, the higher is the noise of the frequency synthesizer, and, respectively, the less noise is desired, the slower is the change of frequency. The speed requirement, that is, the time allowed to move from one frequency of the frequency synthesizer to another varies between radio systems, being 600 to 800 microseconds in GSM and PCN, for example.

SUMMARY OF THE INVENTION

An object of the present invention is to attain a method and apparatus by which it is possible to implement a dual band direct conversion transceivers in which only one frequency synthesizer is used to generate the required transmission and reception channel frequencies.

An accurate reference oscillator is needed in the mobile station in any case: as the locking reference of the frequency synthesis and as the timing signal of the baseband frequency part. In this invention, it has been found that the same reference oscillator can be used to decrease the tuning range and frequency offset of the frequency synthesis by using it directly or multiplied as an offset oscillator for the mixer. Thus the reference oscillator operates as an accurate frequency reference for the frequency synthesis, as an accurate constant frequency source for the mixer and as a timing signal for the baseband part.

The invention is based on the idea that one frequency synthesizer and one reference oscillator, which generates an essentially constant frequency, are used to generate the required frequencies. Thus the transmission and reception channel frequencies are generated from the frequency mixing results of the frequency synthesizer and the reference oscillator. In accordance with a first embodiment of the invention the reception channel frequencies of the first frequency band are generated with a frequency synthesizer, the transmission channel frequencies of the first frequency band are generated by mixing an essentially constant mixing frequency with the frequency generated by the frequency synthesizer, and the reception channel frequencies of the second frequency band are generated by multiplying the frequency generated with a frequency synthesizer by a constant coefficient, and the transmission channel frequencies of the second frequency band are generated by mixing an essentially constant mixing frequency with the frequency generated by the frequency synthesizer, and by multiplying the frequency generated as the mixing result by a constant coefficient.

According to a second embodiment of the invention, the transmission channel frequencies of the first frequency band are generated by the frequency synthesizer, the reception channel frequencies of the first frequency band are generated by mixing an essentially constant mixing frequency with the frequency generated by the frequency synthesizer, the transmission channel frequencies of the second frequency band are generated by multiplying the frequency generated with the frequency synthesizer by a constant coefficient, and the reception channel frequencies of the second frequency band are generated by mixing an essentially constant mixing frequency with the frequency generated by the frequency synthesizer, and by multiplying the frequency thus generated as the mixing result by a constant coefficient.

According to a third embodiment of the invention, two mixing results are generated from the frequency generated by the frequency synthesizer and the frequency generated by the reference oscillator, whereby the reception channel frequencies of the first frequency band are generated from the first mixing result, the transmission channel frequencies of the first frequency band are generated from the second mixing result, the reception channel frequencies of the second frequency band are generated by multiplying the first mixing result by a constant coefficient, and the transmission channel frequencies of the second frequency band are generated by multiplying the second mixing result by a constant coefficient.

The method according to the invention is characterized in what is said in the characterizing part of the appended claim 1.

The apparatus according to the invention is characterized in what is said in the characterizing part of the appended claim 9.

By the present invention it is possible to implement a direct conversion transceiver operating in two different frequency bands by using only one frequency synthesizer. The tuning range of the frequency synthesizer can also be made relatively small compared to the nominal frequency, whereby a high-quality frequency synthesizer of the prior art technology can be used as the frequency synthesizer in the invention.

BRIEF DESCRIPTION OF THE INVENTION

In the following, the invention will be described in more detail with reference to the accompanying drawings in which.

DETAILED DESCRIPTION OF THE INVENTION

Some frequency values selected to generate the frequencies used in the GSM and PCN systems are mentioned in connection with the description by way of example. The transmission and reception frequency bands used in these systems are as follows, and the following frequencies are selected as the internal frequencies of the mobile stations used in the systems in order to apply the first embodiment of the invention:

GSM
Reception
reference oscillator frequency LO4 (constant): 52 MHz
reception frequency band: 925 to 960 MHz
frequency synthesizer frequency LO3: 925 to 960 MHz
receiver local oscillator frequency LO1: 925 to 960 MHz
Transmission
reference oscillator frequency LO4 (constant): 52 MHz
transmission frequency band: 880 to 915 MHz
frequency synthesizer frequency LO3: 932 to 967 MHz
transmitter local oscillator frequency LO2
(=LO3−LO4): 880 to 915 MHz
PCN
Reception
reference oscillator frequency LO4 (constant): 52 MHz
reception frequency band: 1805 to 1880 MHz
frequency synthesizer frequency LO3: 902.5 to 940 MHz
receiver local oscillator frequency LO1: 1805 to 188 MHz
Transmission
reference oscillator frequency LO4 (constant): 52 MHz
transmission frequency band: 1710 to 1785 MHz
frequency synthesizer frequency LO3: 907 to 944.5 MHz
transmitter local oscillator frequency LO2
(=2·(LO3−LO4)): 1710 to 1785 MHz From the above it can be seen that the frequency synthesizer frequencies LO3 of reception and transmission in both systems are essentially the same.

FIG. 2 shows a block diagram of the radio frequency parts of a mobile station operating in two different frequency bands in accordance with the invention. Blocks 2 to 5 depict the radio frequency part of the receiver, block 12 depicts a frequency synthesizer and blocks 7 to 11 depict a transmitter. Block 14 depicts a reference oscillator, which generates an essentially constant frequency.

In the embodiment of FIG. 2, the frequency generated by the reference oscillator 14 is 52 MHz. This can be implemented by a 13 MHz crystal oscillator, for example, the frequency of which is multiplied by four (not shown). Block 12 depicts a frequency synthesizer, which is selected as operating in the 900 MHz band in both systems. To advantage, the frequency synthesizer 12 comprises a voltage controlled oscillator VCO and a phase-locked loop PLL. In addition, a reference oscillator 14, such as a crystal oscillator, is needed. The frequency of the reference oscillator must be as precise as the general frequency precision of the system requires. Generally, the reference oscillator is locked at the base station frequency (AFC). This precise frequency can then be used to lock the local oscillator frequencies by means of phase-locked loops (PLL). In a digital mobile station, the local oscillator frequency is determined by the channel spacing and the bit rate. In GSM, for example, the channel spacing is 200 kHz and the bit rate 270.833 kbits/s=270 5/6 kbits/s. The oscillator frequency must have an integer ratio to each of these frequencies: the phase-locked loop needs a frequency of the channel spacing as its phase comparison frequency, and the logic part of the phone needs a frequency in proportion to the bit rate as its timing signal. The smallest common frequency is thus 13 MHz.

The fourth harmonic of this frequency is 52 MHz, which differs only by 7 MHz from the duplex separation. Thus by using the 52 MHz frequency, the 45 MHz frequency hop required by the duplex separation can be considerably decreased, and the tuning range of the voltage controlled oscillator VCO can also be decreased accordingly. In the PCN system, the duplex separation is 95 MHz, and there a suitable frequency for decreasing the frequency hop of the voltage controlled oscillator VCO is 104 MHz=8×13 MHz. In this invention, however, the generation of PCN frequencies is based on multiplication by two, and so the reference oscillator frequency can be 52 MHz in both systems. The implementation of a voltage controlled oscillator VCO and a phase-locked loop PLL is known to a person skilled in the art, and therefore they are not described in more detail here.

The received signal comes from the antenna ANT to the transmission/reception switch 1. At the reception stage the transmission/reception switch is in a position in which the received signal is directed to the receiver blocks. From the transmission/reception switch 1, the received signal is taken in the reception frequency FRX through a first passband filter 2, a pre-amplifier 3 and a second passband filter 4 to a demodulator 5. In the demodulator 5, the reception frequency signal FRX is mixed with the local oscillator frequency LO1 of the receiver, which has the reception channel frequency, whereby the mixing result is a baseband signal corresponding to the original signal. The demodulator 5 is most advantageously an I/Q demodulator, whereby the demodulator 5 generates both the I and Q demodulated signals. The demodulated signals are directed through the first low pass filter 6. From the output of the first low pass filter 6 the signals I-RX, Q-RX are directed to the other stages (not shown) of the receiver for further processing.

Similarly, in the transmitter the outgoing signal I-TX, Q-TX coming to the modulator is taken from the modulator 7, preferably an I/Q modulator, to a buffer amplifier 8. In addition to the outgoing baseband signal, the local oscillator frequency LO2 of the transmitter, which has the transmission channel frequency, is brought to the modulator 7 as the carrier signal of the modulator. In the buffer amplifier 8 the transmission frequency signal FTX is amplified and taken through a third passband filter 9 to a power amplifier 10. The amplified transmission frequency signal is taken from the power amplifier 10 through the transmission frequency low pass filter 11 to the transmission/reception switch 1. At the transmission stage, the transmission/reception switch 1 is in the transmission position, whereby the transmission frequency signal coming to the switch 1 is led to the antenna ANT. If a requirement of the system, such as that of spurious transmission, so demands, the low pass filter 11 must be replaced by a passband filter. The passband filter can be combined with the first passband filter 2 on the reception side, in which case the filter is actually a duplex filter, whereby the transmission/reception switch 1 is not needed.

Intermediate frequency stages are not used at all in a direct conversion receiver, whereby the local oscillator frequency LO1 of the receiver is set at the received channel frequency. Similarly in a direct conversion transmitter, the local oscillator frequency LO2 of the transmitter is set at the transmitted channel frequency FTX. In the embodiment shown in FIG. 2, frequency LO3 generated by the frequency synthesizer 12 is used as the local oscillator frequency LO1 of the receiver. The local oscillator frequency LO2 of the transmitter is generated so that frequency LO4 of the reference oscillator 14 is mixed with the frequency of the frequency synthesizer 12 in the mixer 13.

In the GSM system, the difference between the transmission and reception frequency bands is 45 MHz, whereby the difference between the local oscillator frequency LO1 of the receiver and the local oscillator frequency LO2 of the transmitter is 45 MHz. Correspondingly, in the PCN system the difference between the transmission and reception frequency bands is 95 MHz, whereby the difference between the local oscillator frequency LO1 of the receiver and the local oscillator frequency LO2 of the transmitter is 95 MHz.

Figure 3A:
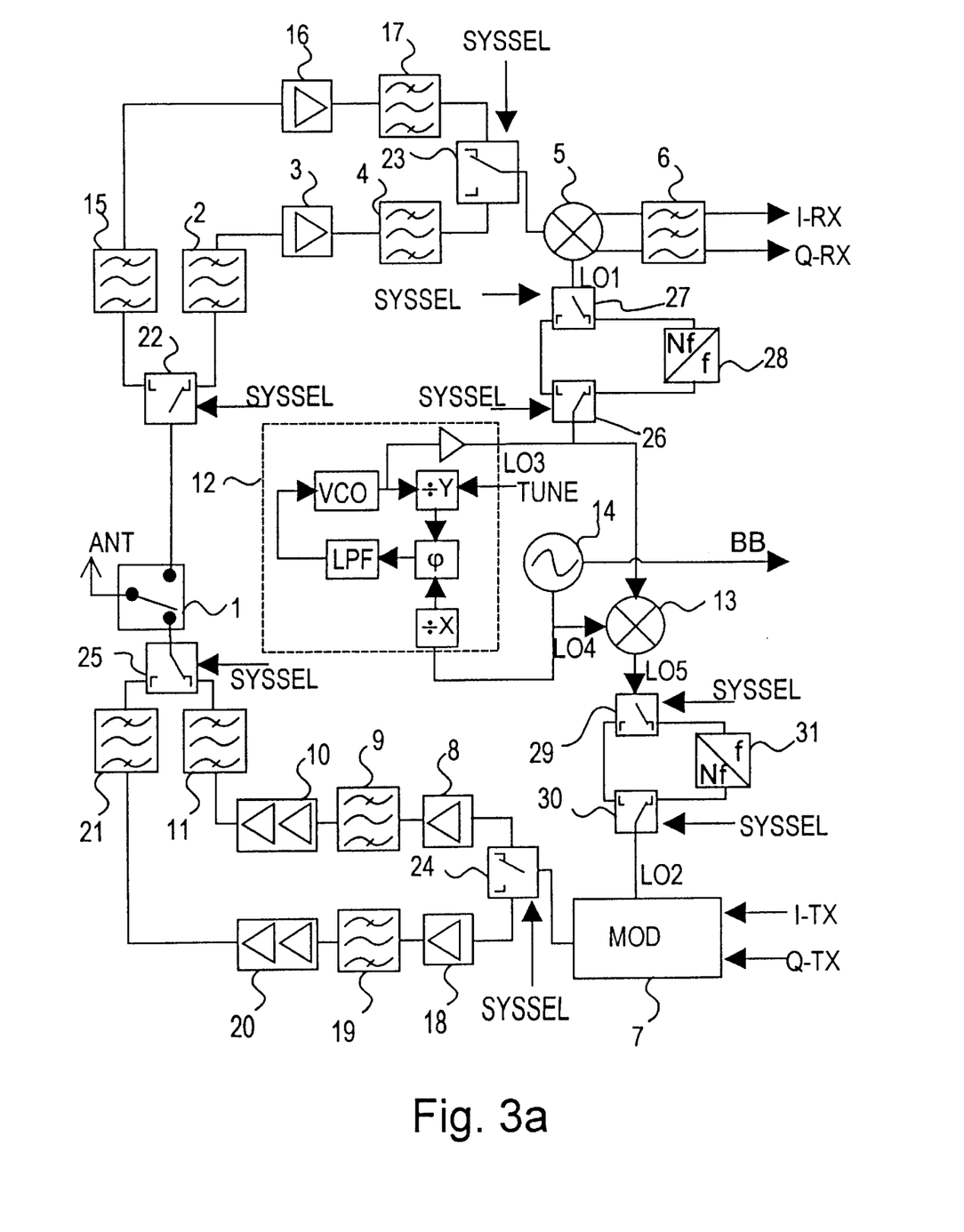
FIG. 3a shows a radio frequency part of a dual band direct conversion transceiver according to a preferred embodiment of the invention as a simplified block diagram.

FIG. 3a shows a block diagram of the radio frequency parts of a dual band direct conversion transceiver according to the invention. For each frequency band the receiver has a separate front end, which comprises a first passband filter 2, 15, a pre-amplifier 3, 16 and a second passband filter 4, 17. Correspondingly in the transmission side there is a buffer amplifier 8, 18, a third passband filter 9, 19, a power amplifier 10, 20 and a second low pass filter for each frequency band.

In order to use different parts when operating in different frequency bands, two-way switches 22, 23 are applied in the transmission/reception switch 1 and the antenna-side line of the demodulator 5. In the transmission side, the two-way switches for selecting the frequency band are in the transmission/reception switch 1 and in the modulator-side line of the buffer amplifier 8. When operating in two different frequency bands, the two first passband filters 2, 15, the two pre-amplifiers 3, 16 and the two second passband filters 4, 17 are used in signal reception. Correspondingly, two buffer amplifiers 8, 18, two third passband filters 9, 19, two power amplifiers 10, 20 and two second low pass filters 11, 21 are used in signal transmission. By means of the two-way switches 22, 23, 24, 25, one block of each two similar blocks can always be selected for use. In order to generate two different local oscillator frequencies LO1 of the receiver, two-way switches 26, 27 and a first frequency multiplier 28 are applied between the frequency synthesizer 12 and the demodulator 5. Thus either the frequency generated by the frequency synthesizer 12 or that frequency multiplied by N can be selected as the local oscillator frequency LO1 of the receiver to be directed to the demodulator 5. On the transmission side, two-way switches 29, 30 and a second frequency multiplier 31 are applied between the mixer 13 and the modulator 7 for generating two different local oscillator frequencies LO2 of the transmitter.

The frequency generated by the frequency synthesizer 12 is also directed to the mixer 13, in which a frequency generated by the reference oscillator 14 is mixed with that frequency. The mixing result of the mixer 13 is an intermediate mixed frequency LO5. By means of two-way switches 29 and 30, either the intermediate mixed frequency LC)5 or LO5 multiplied by the constant N can be selected as the local oscillator frequency LO2 of the receiver to be directed to the modulator 7. At the frequencies presented here, the antenna ANT is a combined antenna of multiple frequency bands. For the rest, the radio frequency parts are similar for both transmission and reception frequency bands.

The two-way switches 22–27, 29, 30 can be implemented by PIN diodes or GaAsFET transistors, for example. The two-way switches are preferably controlled by a two-level signal SYSSEL, whereby at the first level of the control signal the two-way switches are in a position in which the radio frequency circuits of the first frequency band are used, and at the second level of the control signal the two-way switches are in a position in which the radio frequency circuits of the second frequency band are used. The values corresponding to the first and second level of the control signal SYSSEL depend, among other things, on the implementation of the two-way switches. Instead of the two-way switches 22–27, 29, 30, some other known method can be applied for changing the route of the radio frequency signal.

The two-way switches 23, 25 can be replaced by matching means, which are known as such, and when the first frequency band is used, the radio frequency circuits of the second frequency band have a high impedance for the signals of the first frequency band. Correspondingly, when the second frequency band is used, the radio frequency circuits of the first frequency band have a high impedance for the signals of the second frequency band. Thus the radio frequency circuits of different frequency bands do not interfere with the operation of one another.

In the embodiment according to FIG. 2, the selection of the local oscillator frequency LO1 has been implemented by means of one frequency multiplier 28, the coefficient N of which can be set by the control signal SYSSEL. Thus on the first level of the control signal SYSSEL, the coefficient N is one, for example, and on the second level of the control signal SYSSEL, the coefficient N is two. In the embodiment of FIG. 2, the second mixing frequency LO2 of the transmission side has been generated by the second frequency multiplier 31, in which the coefficient N can be changed accordingly by means of the control signal SYSSEL. In this embodiment, separate two-way switches 26 97, 29, 30 are not needed.

Figure 4:
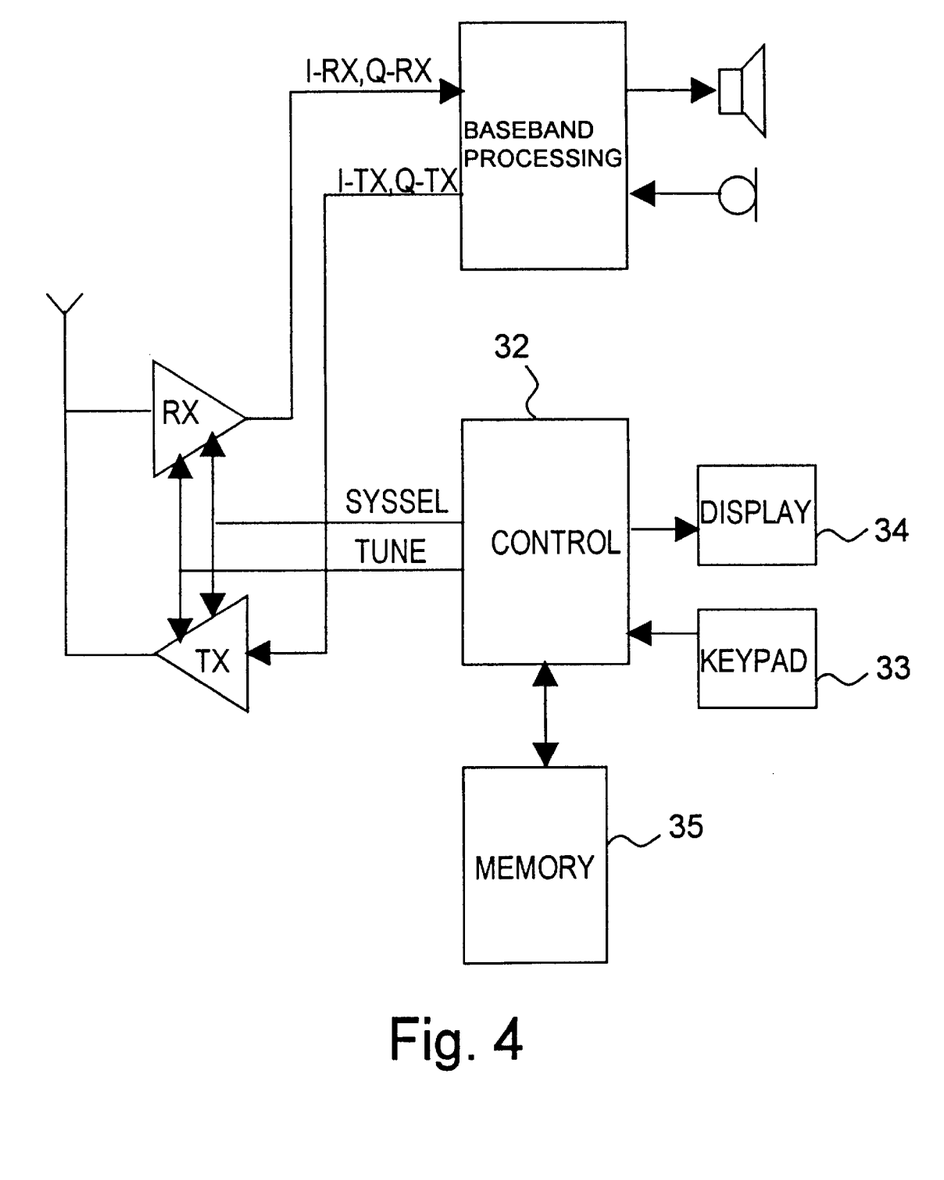
FIG. 4 shows the construction of a mobile station as a simplified block diagram.

The signal SYSSEL, which controls the two-way switches 22–27, 29, 30, is preferably generated in the control part 32 of the mobile station (FIG. 4), which preferably includes a microprocessor. The control part 32 generates a signal according to the system change command given by the user from the keypad 33. The system selection can be menu-based, for example, in which case the desired system is selected from a menu shown on the display 34 by pressing a key. Thus the control part 32 generates a control signal SYSSEL, which corresponds to the system selected. The system change command can also be given by a mobile network system, whereby the mobile station receives data sent by another system. The received data can include a system change command, on the basis of which the control part performs the system change. A control program has been stored in the memory 35 of the control part 32, preferably EPROM or EEPROM, which control program monitors the received data, and when it detects a system change command in the data it gives the control part a command to set the control signal SYSSEL in a state determined by the selection command.

Figure 3B:
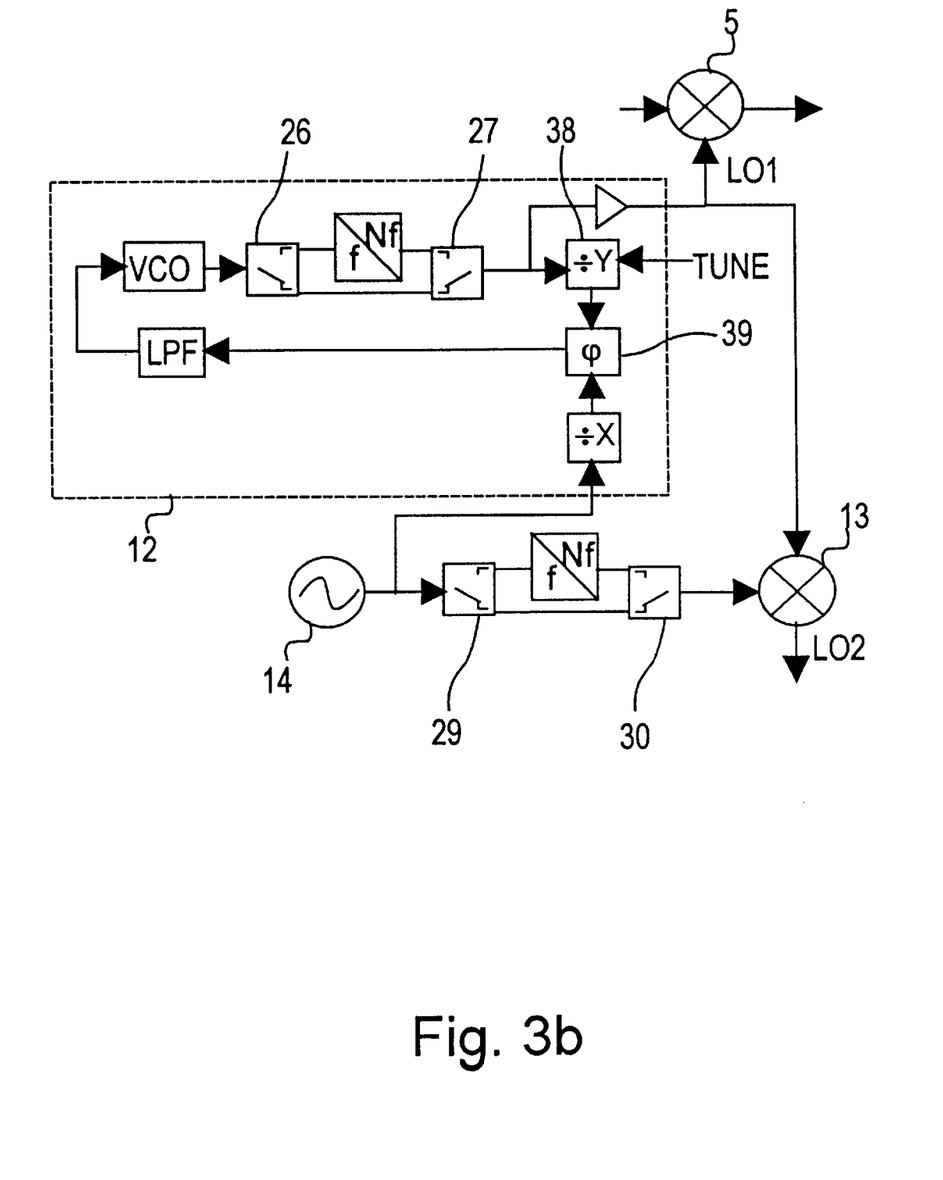
FIG. 3b shows an embodiment of the frequency synthesizer as a simplified block diagram.

The control part 32 generates a TUNE signal, by which a dividing numeral is set for the divider 38 of the frequency synthesizer 12 which numeral corresponds to the selected channel frequency. Then the divider 38 of the frequency synthesizer forms a phase comparison frequency to the phase comparator 39 from the frequency of the voltage controlled oscillator VCO. In the GSM system, the channel spacing is 200 kHz, whereby the phase comparison frequency is 200 kHz. Because of the duplication, the phase comparison frequency is 100 kHz in the PCN system. This can be avoided by placing a frequency multiplier in the phase comparison loop of the frequency synthesizer 12. This alternative is shown in FIG. 3b, in which only the blocks necessary for illustrating the implementation of the frequency synthesizer 12 are shown.

The circuit functions in a manner such that the frequency generated by the reference oscillator 14 is directed to the reference divider X of the frequency synthesizer 12, and the divider X forms the first phase comparison frequency to the phase comparator 39. The frequency of the voltage controlled oscillator VCO is directed to the divider 38 of the frequency synthesizer either directly or multiplied by the constant N. This selection is preferably made by switches 26, 27. The divider 38 forms a second phase comparison frequency for the phase comparator 39 from that frequency. The control part 32 generates a TUNE signal, by which a dividing number is set for the divider 38 of the frequency synthesizer 12, according to the selected channel frequency. Thus in a direct conversion transceiver of a GSM/PCN system, the channel spacing 200 kHz can be used as the phase comparison frequency in each system, whereby sideband problems can be avoided. The division relation of the reference divider X need not be changed, either, when changing between systems. The frequency of the voltage controlled oscillator VCO is directed to the demodulator 5 and the mixer 13 either directly or multiplied by the constant N. The frequency generated by the reference oscillator 14 is directed to the mixing frequency of the mixer 13 either directly or multiplied by the constant N. This selection is preferably made by switches 29, 30.

FIG. 3a shows a dual band direct conversion transceiver according to the invention, in which the first frequency band comprises the frequency band of the GSM system, and the second frequency band comprises the frequency band of the PCN system. Thus the passband width of the first passband filter 2 and the second passband filter 4 of the first frequency band is approx. 925 to 960 MHz. The passband width of the first passband filter 15 and the second passband filter 17 of the second frequency band is approx. 1805 to 1880 MHz. Correspondingly in the transmitter the passband width of the third passband filter 9 of the first frequency band is approx. 880 to 915 MHz and the passband width of the third passband filter 18 of the second frequency band is approx. 1710 to 1785 MHz. The frequency band of the second low pass filter 11 of the first frequency band comprises frequencies under 915 MHz, and the frequency band of the second low pass filter 21 of the second frequency band comprises frequencies under 1785 MHz. In the embodiment of FIG. 3a, the frequency synthesizer 12 has been set to operate in the reception frequency band of the first frequency band, that is, in the reception frequency band 925 to 960 MHz of the GSM system. When a signal of the GSM system is received, the frequency synthesizer 12 is set at the reception channel, that is, at some of the reception frequencies of the GSM system between 925 and 960 MHz. The frequency of the transmission channel corresponding to the reception channel is 45 MHz lower, and thus the local oscillator frequency LO2 of the transmitter must be 45 MHz lower than the local oscillator frequency LO1 of the receiver. The frequency of the reference oscillator 14 is advantageously generated as a multiple of 13 MHz, as is set out in the description of the embodiment shown in FIG. 2, and thus 52 MHz is selected as the reference oscillator frequency in the embodiment shown in FIG. 3a. At the transmission stage, the frequency of the frequency synthesizer 12 is then raised by 7 MHz regardless of the channel in which the operation takes place and the mixing result is an intermediate mixing frequency LO5 which is 45 MHz (52−7) smaller than the mixer frequency used in reception. Thus the frequency synthesizer 12 must be tunable for transmission to the frequencies (925+7) to (960+7) MHz. that is, 932 to 967 MHz.

The second frequency band in the example of FIG. 3a comprises the frequency band of the PCN system, or the reception frequencies 1805 to 1880 MHz and the transmission frequencies 1710 to 1785 MHz. The frequencies of the PCN system are thus about twice the frequencies of the GSM system, whereby the selected coefficient of the multiplier 28 of the first frequency and of the multiplier 31 of the second frequency is two. When a signal of a PCN system is received, the frequency synthesizer 12 is set at a frequency which is half the frequency of the received channel. Thus the frequency generated by the frequency synthesizer 12 is between 902.5 and 940 MHz (1805/2 and 1880/2). For the transmitter, the intermediate mixing frequency LO5 is half the frequency of the transmission channel of the PCN system, or 855 to 892.5 MHz (1710/2 to 1785/2). Since the frequency of the reference oscillator 14 is the same regardless of the system in which the operation takes place, the frequency generated by the frequency synthesizer 12 is 907 to 944.5 MHz in PCN transmission. The frequency of the frequency synthesizer 12 is thus to be raised by 4.5 MHz when changing from reception to transmission.

Figure 5A:
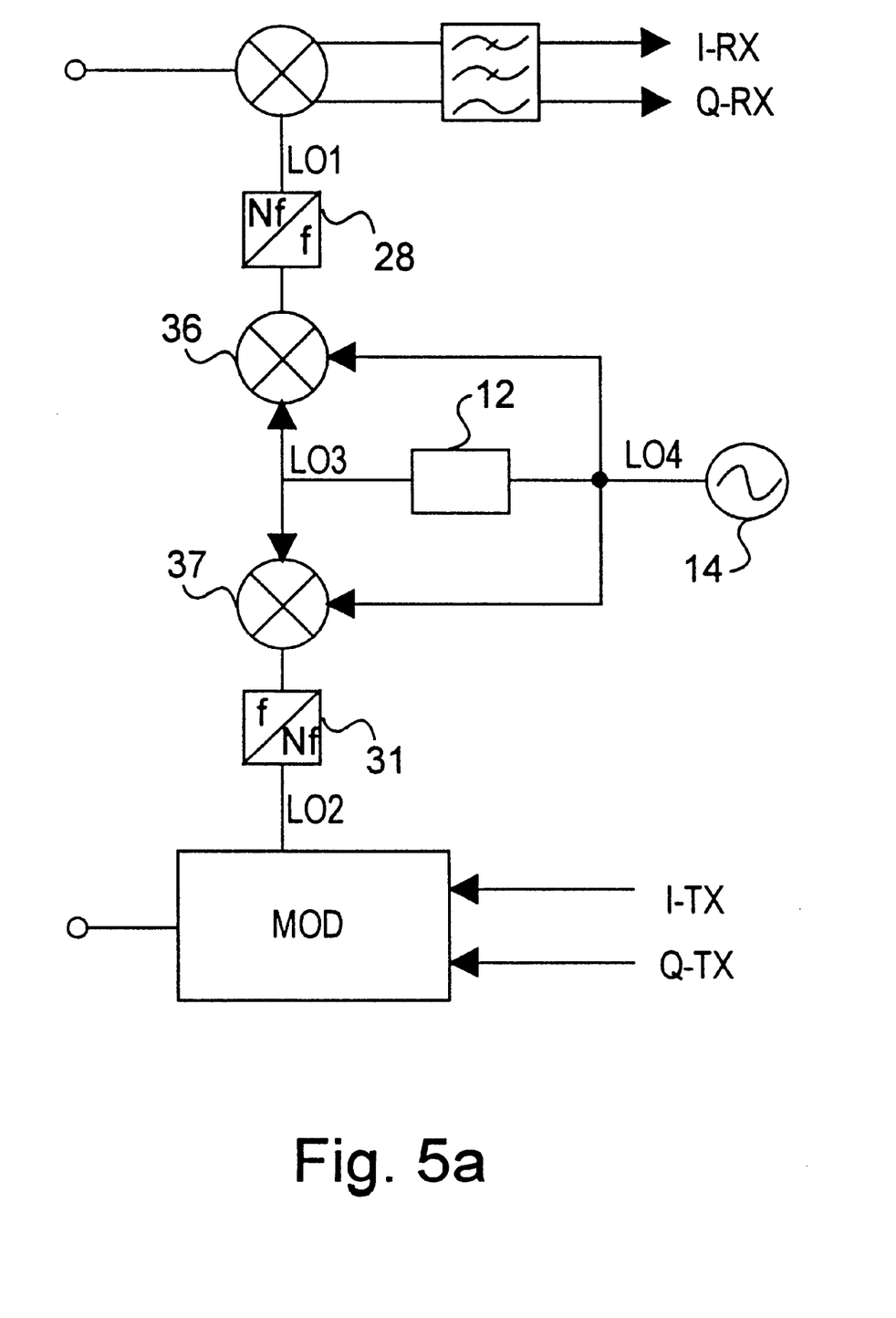
FIG. 5a shows another preferred embodiment of the invention for generating the local oscillator frequencies.

FIG. 5a shows another embodiment for generating the local oscillator frequencies LO1, LO2. In this embodiment, the frequency of the reference oscillator 14 is directed to the frequency synthesizer 12, to the up-converter 36 and the down-converter 37. Thus the local oscillator channel frequency LO1 of the receiver is the sum of the frequency generated by the reference oscillator 14 and the frequency generated by the frequency synthesizer 12 multiplied by the constant coefficient N. The local oscillator frequency LO2 of the transmitter is the difference between the frequency generated by the frequency synthesizer 12 and the frequency generated by the reference oscillator 14 multiplied by the constant coefficient N. When the second embodiment of the invention is applied in the GSM/PCN systems, the frequencies used in the systems are selected as follows:
GSM
Reception
reference oscillator frequency LO4 (constant): 26 MHz
reception frequency band: 925 to 960 MHz
frequency synthesizer frequency LO3: 899 to 934 MHz
local oscillator frequency of receiver LO1
(=LO3+LO4): 925 to 960 MHz
Transmission
reference oscillator frequency LO4 (constant): 26 MHz
transmission frequency band: 880 to 915 MHz
frequency synthesizer frequency LO3: 906 to 941 MHz local oscillator frequency of transmitter LO2
(=LO3−LO4): 880 to 915 MHz
PCN
Reception
reference oscillator frequency LO4 (constant): 26 MHz
reception frequency band: 1805 to 1880 MHz
frequency synthesizer frequency LO3: 876.5 to 914 MHz
local oscillator frequency of receiver LO1
(=2·(LO3 +LO4)): 1805 to 1880 MHz
Transmission
reference oscillator frequency LO4 (constant): 26 MHz
transmission frequency band: 1710 to 1785 MHz
frequency synthesizer frequency LO3: 881 to 918.5 MHz
local oscillator frequency of transmitter LO2
(=2·(LO3−LO4)): 1710 to 1785MHz When this embodiment is applied in a GSM system, the constant coefficients of the frequency multipliers are set as one, and in the PCN system the coefficients are set as two. The frequency multipliers can also be implemented as in the embodiment of FIG. 3a by two-way switches and a frequency multiplier 28, 31, in which a fixed constant coefficient is used; in this case the constant coefficient is two. The embodiment of FIG. 5a can also be implemented by one mixer, in which case from the output of the mixer there are available both the sum and the difference of the frequency LO3 of the frequency synthesizer 12 and the frequency LO4 of the reference oscillator 14 whereby the sum of the frequencies LO3, LO4 is conveniently selected as the local oscillator frequency LO1 of the receiver, and the difference of the frequencies LO3, LO4 is selected as the local oscillator frequency LO2 of the transmitter.

Figure 5B:
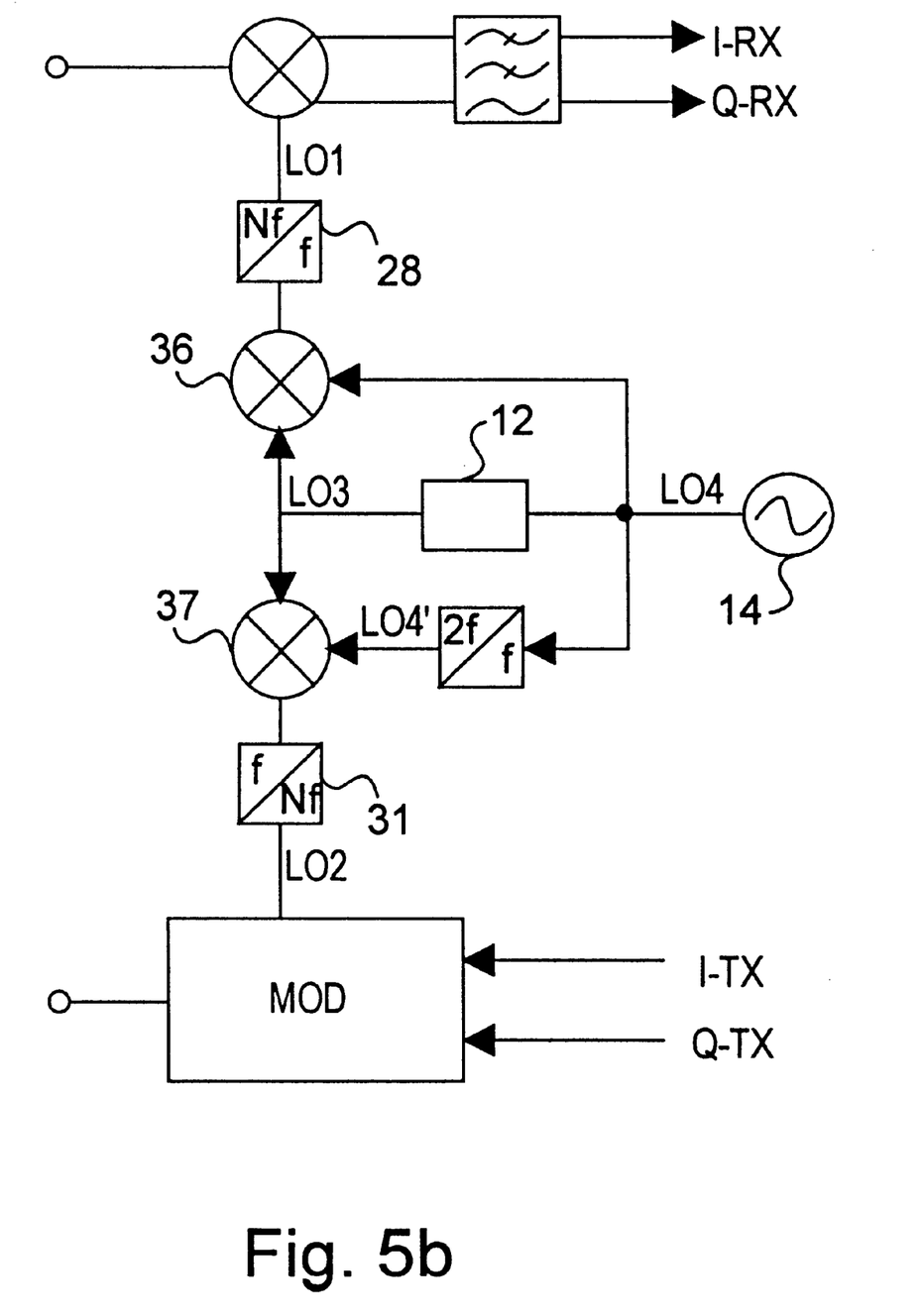
FIG. 5b shows a third preferred embodiment of the invention for generating the local oscillator frequencies.

FIG. 5b shows another embodiment in which the local oscillator frequency LO1 of the receiver and the local oscillator frequency LO2 of the transmitter are generated by mixing the frequency LO3 generated by the frequency synthesizer 12 with the frequency LO4 generated by the reference oscillator 14. The difference compared to the embodiment of FIG. 5a is mainly that, in addition to the frequency generated by the frequency synthesizer 12, the frequency generated by the reference oscillator 14 and multiplied by two is directed to the mixer at the transmission stage. At the reception stage, the frequency LO3 generated by the frequency synthesizer 12 and the frequency LO4 generated by the reference oscillator 14 are directed to the mixer. When the third embodiment of the invention is applied in the GSM and PCN systems, the internal frequencies of the mobile station are selected as follows:
GSM
Reception
reference oscillator frequency LO4 (constant): 52 MHz
reception frequency band: 925 to 960 MHz
frequency synthesizer frequency LO3: 977 to 1012 MHz
local oscillator frequency of receiver LO1
(=LO3−LO4): 925 to 960 MHz
Transmission
reference oscillator frequency LO4 (constant): 52 MHz
transmission frequency band: 880 to 915 MHz
frequency synthesizer frequency LO3: 984 to 1019 MHz
local oscillator frequency of transmitter LO2
(=LO3−2·LO4): 880 to 915 MHz
PCN
Reception
reference oscillator frequency LO4 (constant): 52 MHz
reception frequency band: 1805 to 1880 MHz
frequency synthesizer frequency LO3: 954.5 to 992 MHz
local oscillator frequency of receiver LO1
(=2·(LO3−LO4)): 1805 to 1880 MHz
Transmission
reference oscillator frequency LO4 (constant): 52 MHz
transmission frequency band: 1710 to 1785 MHz
frequency synthesizer frequency LO3: 959 to 996.5 MHz
local oscillator frequency of transmitter LO2
(=2·(LO3−2·LO4)): 1710 to 1785 MHz In the embodiments of the FIGS. 5a and 5b described above, the frequencies LO3 generated by the frequency synthesizer 12 in reception and transmission are essentially the same in both systems, whereby the frequency offset required to be performed by the frequency synthesizer 12 is sufficiently small to be implemented in practice.

On the basis of the above it can be stated as a summary that in the embodiment of FIG. 3a, the tuning range of the frequency synthesizer 12 comprises the frequencies 902.5 to 967 MHz. The average frequency of the tuning range is approx. 934.75 MHz and its width is 64.5 MHz, whereby the width of the tuning range of the frequency synthesizer in relation to the average frequency is 64.5/934.75 or approx. 6.9%.

The invention can also be applied in a manner such that the intermediate mixing frequency LO5 needed in transmission is generated by the frequency synthesizer 12, and the local oscillator frequency LO1 of the receiver is generated by means of mixer 13 and reference oscillator 14. In this case, the tuning range is 850.5 to 915 MHz and the average frequency of the tuning range is 882.75 MHz, whereby the width of the tuning range of the frequency synthesizer in relation to the average frequency is 64.5/882.75 or 7.3%, which is somewhat higher than in the embodiments of FIGS. 2 and 3a. In addition, the invention can also be applied in a manner such that, the frequency synthesizer 12 is set to operate in another frequency band, in this case the frequency band of the PCN system, whereby the constant of the first frequency multiplier 28 and the second frequency multiplier 31 is 0.5. In this case, the reference oscillator frequency must be 104 MHz.

In the embodiment of FIG. 5a, the tuning range of the frequency synthesizer 12 comprises the frequencies 876.5 to 941 MHz. The average frequency of the tuning range is 908.75 MHz and the width 64.5 MHz, whereby the width of the tuning range of the frequency synthesizer in relation to the average frequency is approx. 7.1%. Correspondingly, in the embodiment of FIG. 5b the tuning range of the frequency synthesizer 12 is 954.5 to 1019 MHz, the average frequency of the tuning range is 986.75 MHz and the width 64.5 MHz. In this case, the width of the tuning range of the frequency synthesizer in relation to the average frequency is approx. 6.5%.

When changing between reception and transmission, the frequency change of the frequency synthesizer is constant regardless of which reception or transmission channel is in use at the time. A constant frequency offset like this can simply be generated by the frequency synthesizer. The frequencies used in a direct conversion transmitter receiver according to the invention naturally depend on the systems in which the transceiver is used. In addition to the GSM and PCN systems mentioned, a direct conversion transceiver can also be used in other systems, such as the DECT. Then one possibility would be to implement a dual band mobile station intended to operate in the GSM and DECT systems.

Although the radio frequency parts comprise dedicated blocks for each frequency band in the embodiment of FIG. 3a, the radio frequency part can also be implemented by some other solution of a well-known technology. For example, some of the amplifiers can be of the wideband type, whereby the same amplifier can operate in both frequency bands. On the other hand, more two-way switches are needed in this solution. The filters can also be adjustable, in which case they are specially adjusted for the frequency band which is in use at the time.

When a mobile station which incorporates a dual band direct conversion transceiver according to the invention is switched on, it can, for example, scan all the channels available in the systems. This can be done by setting the two-way switches 22–27, 29, 30 in a position in which the radio frequency circuits of the first frequency band are used. After this, the mobile station scans all the receiving channels of the first frequency band and makes a list of the strongest channels. Next the status of the two-way switches is changed to use the radio frequency circuits of the second frequency band. The receiving channels of the second system are also scanned and a list is made of the strongest channels. After this a comparison of the strengths measured for different channels is made and a channel with the strongest signal is selected. The two-way switches are set to use the RF circuits of the system in which the strongest signal is detected. The frequency synthesizer is set at a frequency which corresponds to the selected channel.

The mobile station can also measure the signal levels during use, and when it detects a need to change the channel, it performs the operations required for changing the channel and/or the system.

The invention is not limited to the above described embodiments only, but it can be modified within the scope defined by the attached claims.

What is claimed is:

1. A method for generating frequencies in a transceiver of a radio communication system operating in two different frequency bands, in which a first frequency band comprises a first transmission frequency band and a first reception frequency band, and a second frequency band comprises a second transmission frequency band and a second reception frequency band, wherein the frequencies are generated by using one frequency synthesizer (12) and a reference oscillator (14), which generates an essentially constant mixing frequency (LO4), wherein the frequency band of the frequency synthesizer (12) comprises at least a first reception frequency band, whereby reception channel frequencies (LO1) of the first frequency band are generated with the frequency synthesizer (12), transmission channel frequencies (LO2) of the first frequency band are generated by mixing the essentially constant mixing frequency (LO4) with a frequency generated with a frequency synthesizer (12), reception channel frequencies (LO1) of the second frequency band are generated by multiplying a frequency (LO3) generated with the frequency synthesizer (12) by a constant coefficient, and transmission channel frequencies (LO2) of the second frequency band are generated by mixing the essentially constant mixing frequency synthesizer (LO4) with the frequency (LO3) generated with the frequency synthesizer (12) and by multiplying the frequency generated as the mixing result by a constant coefficient.

2. A method according to claim 1, wherein the frequency band of the frequency synthesizer (12) comprises at least the first transmission frequency band, whereby:

the transmission channel frequencies (LO2) of the first frequency band are generated with the frequency synthesizer (12), the reception channel frequencies (LO1) of the first frequency band are generated by mixing the essentially constant mixing frequency (LO4) with the frequency (LO3) generated with the frequency synthesizer (12), the transmission channel frequencies (LO2) of the second frequency band are generated by multiplying the frequency (LO3) generated with the frequency synthesizer (12) by a constant coefficient, and the reception channel frequencies (LO1) of the second frequency band are generated by mixing the essentially constant mixing frequency (LO4) with the frequency (LO3) generated with the frequency synthesizer (12) and by multiplying the frequency generated as the mixing result by a constant coefficient.

3. A method according to claim 1, wherein two mixing results are generated from the frequency generated with the frequency synthesizer (12) and the frequency generated with the reference oscillator (14), whereby:

a first mixing result is used to generate the reception channel frequency (LO1) of the first frequency band, a second mixing result is used to generate the transmission channel frequency (LO2) of the first frequency band, the first mixing result is multiplied by a constant coefficient to generate the reception channel frequency (LO1) of the second frequency band, and the second mixing result is multiplied by a constant coefficient to generate the transmission channel frequency (LO2) of the second frequency band.

4. A method according to claim 1, wherein the constant coefficient is 2.

5. A method according to claim 1, wherein the first frequency band is a GSM frequency band and the second frequency band is a PCN frequency band.

6. A method according to claim 1, wherein the first frequency band is a GSM frequency band and the second frequency band is a DECT frequency band.

7. A method according to claim 1, wherein the reference oscillator (14) is used as the reference of the frequency synthesizer (12), to generate the constant mixing frequency (LO4) and a timing signal for a baseband part (BB).

8. The use of a method according to claim 1, in a dual band mobile station.

9. A dual band direct conversion transceiver, in which a first frequency band comprises a first transmission frequency band and a first reception frequency band, and a second frequency band comprises a second transmission frequency band and a second reception frequency band, wherein the direct conversion transceiver comprises a frequency synthesizer (12), means (13, 14) for generating transmission channel frequencies (LO2) of the first frequency band and for generating reception channel frequencies (LO1) of the first frequency band, and means (13, 14, 28, 31) for generating transmission channel frequencies (LO2) of the second frequency band and for generating reception channel frequencies (LO1) of the second frequency band, wherein the frequency band of the frequency synthesizer (12) comprises at least a first reception frequency band, whereby reception channel frequencies (LO1) of the first frequency band are generated with the frequency synthesizer (12), transmission channel frequencies (LO2) of the first frequency band are generated by mixing the essentially constant mixing frequency (LO4) with a frequency generated with a frequency synthesizer (12), reception channel frequencies (LO1) of the second frequency band are generated by multiplying a frequency (LO3) generated with the frequency synthesizer (12) by a constant coefficient, and transmission channel frequencies (LO2) of the second frequency band are generated by mixing the essentially constant mixing frequency synthesizer (LO4) with the frequency (LO3) generated with the frequency synthesizer (12) and by multiplying the frequency generated as the mixing result by a constant coefficient.

10. A direct conversion transceiver according to claim 9, wherein said means (13, 14) for generating the transmission channel frequencies of the first frequency band and for generating the reception channel frequencies of the first frequency band comprise a reference oscillator (14) and a mixer, (13), and said means (13, 14, 28, 31) for generating the transmission channel frequencies of the second frequency band and the reception channel frequencies of the second frequency band comprise a first frequency multiplier (28) and a second frequency multiplier (31).

11. A direct conversion transceiver according to claim 10, wherein the coefficient of the first frequency muLtiplier (28) is 2 and the coefficient of the second frequency multiplier (31) is 2.

12. A direct conversion transceiver according to claim 9, wherein the first frequency band comprises a GSM frequency band and the second frequency band comprises a PCN frequency band.

13. A direct conversion transceiver according to claim 9, wherein the first frequency band comprises a GSM frequency band and the second frequency band comprises a DECT frequency band.

14. The use of a direct conversion transceiver according to claim 9, in a dual band mobile station.

15. A dual band direct conversion transceiver in which:

a first frequency band comprises a first transmission frequency band and a first reception frequency band, and a second frequency band comprises a second transmission frequency band and a second reception frequency band, wherein the direct conversion transceiver comprises a frequency synthesizer (12), means (14, 28, 36) for generating reception channel frequencies (LO1) of the first and second frequency band, and means (14, 31, 37) for generating transmission channel frequencies (LO2) of the first and second frequency band, wherein the frequency band of the frequency synthesizer (12) comprises at least a first reception frequency band, whereby reception channel frequencies (LO1) of the first frequency band are generated with the frequency synthesizer (12), transmission channel frequencies (LO2) of the first frequency band are generated by mixing the essentially constant mixing frequency (LO4) with a frequency generated with a frequency synthesizer (12), reception channel frequencies (LO1) of the second frequency band are generated by multiplying a frequency (LO3) generated with the frequency synthesizer (12) by a constant coefficient, and transmission channel frequencies (LO2) of the second frequency band are generated by mixing the essentially constant mixing frequency synthesizer (LO4) with the frequency (LO3) generated with the frequency synthesizer (12) and by multiplying the frequency generated as the mixing result by a constant coefficient.

16. A direct conversion transceiver according to claim 15, wherein said means (14, 28, 36) for generating the reception channel frequencies of the first and second frequency band comprise a reference oscillator (14), an up-converter (36) and a first frequency multiplier (28), and said means (14, 31, 37) for generating the transmission channel frequencies of the first and second frequency band comprise a reference oscillator (14), a down-converter (37) and a second frequency multiplier (31).

17. A method for generating frequencies in a transceiver of a radio communication system operating in a set of communication bands including a plurality of transmission bands and a plurality of reception bands, wherein the method provides for generation of frequencies for respective ones of the bands by steps of:

applying a reference signal from a reference oscillator to a phase locked loop, said applying step including a step of scaling a first frequency of the reference signal by a first scale factor;

within the phase locked loop, scaling a second frequency of a signal outputted by a voltage controlled oscillator (VCO) by a second scale factor;

mixing the VCO signal with the reference oscillator signal to provide a mixed signal having a third frequency offset from both of said first and said second frequencies; and employing said second and said third frequencies as reference signals for operation of said set of communication bands.

18. A method according to claim 17 wherein said first scale factor differs from said second scale factor.

19. A dual band direct conversion transceiver, operative with a set of communication bands including a plurality of transmission bands and a plurality of reception bands, the transceiver including circuitry for generation of reference signals for operation of said set of communication bands, said circuitry comprising:

a reference oscillator, a first frequency scaling means, a mixer, and a phase locked loop (PLL) comprising a voltage controlled oscillator (VCO) and a second frequency scaling means;

wherein said first scaling means couples said reference oscillator to said PLL for scaling a first frequency of a signal outputted by said reference oscillator by a first scale factor;

said second scaling means is operative within said PLL to scale a second frequency of a signal outputted by said VCO by a second scale factor; and said mixer is operative to mix the VCO signal with the reference oscillator signal to provide a mixed signal having a third frequency offset from both of said first and said second frequencies.

20. A method according to claim 19 wherein said first scale factor differs from said second scale factor.

* * * * *